(12) United States Patent
Agarwal

(10) Patent No.: US 7,642,876 B2
(45) Date of Patent: Jan. 5, 2010

(54) PWM GENERATOR PROVIDING IMPROVED DUTY CYCLE RESOLUTION

(75) Inventor: Nitin Agarwal, Meerut (IN)

(73) Assignee: STMicroelectronics PVT. Ltd., Noida (IN)

( * ) Notice: Subject to any disclaimer, the term of this patent is extended or adjusted under 35 U.S.C. 154(b) by 686 days.

(21) Appl. No.: 11/261,449

(22) Filed: Oct. 28, 2005

(65) Prior Publication Data

US 2006/0104343 A1    May 18, 2006

(30) Foreign Application Priority Data

Oct. 29, 2004   (IN) .................. 2156/DEL/2004

(51) Int. Cl.
 *H03K 7/08* (2006.01)
 *H03K 9/08* (2006.01)
(52) U.S. Cl. ............... 332/109; 375/238; 713/501; 363/41; 327/172; 327/177
(58) Field of Classification Search ............. 332/109; 327/172; 375/238; 323/283
See application file for complete search history.

(56) References Cited

U.S. PATENT DOCUMENTS

| | | | |
|---|---|---|---|
| 6,594,308 B1 * | 7/2003 | Galbiati et al. ............. | 375/238 |
| 6,775,158 B2 | 3/2004 | Fu | |
| 6,995,592 B2 * | 2/2006 | Agarwal ................. | 327/172 |
| 7,327,300 B1 * | 2/2008 | Agarwal ................. | 341/152 |
| 2002/0007467 A1 * | 1/2002 | Ma et al. ................. | 713/501 |

FOREIGN PATENT DOCUMENTS

EP        1 087 516        3/2001

* cited by examiner

*Primary Examiner*—Joseph Chang
(74) *Attorney, Agent, or Firm*—Gardere Wynne Sewell LLP

(57) ABSTRACT

A PWM generator system provides improved duty cycle resolution using a sub-cycle generator for generating a sub-cycle with a period that is a small fraction of the maximum PWM period to be generated. An integral sub-cycle estimator is coupled to said sub-cycle generator for determining the integral number of said sub-cycles for on and off time of the PWM waveform. An additional sub-cycle estimator determines the additional fractional sub-cycle required to provide the on and off time. A timer coupled to the integral sub cycle estimator and the additional sub cycle estimator controls PWM output switching for the on and off time of the integral and additional fractional sub cycles.

14 Claims, 6 Drawing Sheets

PWM GENERATOR PROVIDING IMPROVED DUTY CYCLE RESOLUTION

PRIORITY CLAIM

The present application claims priority from Indian Patent Application No. 2156/Del/2004 filed Oct. 29, 2004, the disclosure of which is hereby incorporated by reference.

BACKGROUND OF THE INVENTION

1. Technical Field of the Invention

The present invention relates in general to a Pulse Width Modulation (PWM) generator and particularly to a PWM generator providing improved duty cycle resolution.

2. Description of Related Art

Pulse width modulation (PWM) is a powerful technique for controlling analog circuits with digital outputs. PWM outputs can be generated from a Microprocessor/Micro controller or a Programmable Logic Device. PWM is used in a wide variety of applications, ranging from measurement and communications to power control and conversion.

PWM is a way of digitally encoding analog signal levels. Through the use of high-resolution counters, the duty cycle of a square wave is modulated to encode a specific analog signal level. The PWM signal is still digital because, at any given instant of time, the full DC supply is either fully on or fully off. The voltage or current source is supplied to the analog load by means of a repeating series of on and off pulses. The on-time is the time during which the DC supply is applied to the load, and the off-time is the period during which that supply is switched off. With sufficient bandwidth as input, any analog value can be encoded with PWM.

The instant frequency of the analog input wave is proportional to the parameters as the instant value in the high-resolution counters, the frequency of the PWM waveform and the number of samples of the input analog waveform. PWM duty cycle can be controlled by improving the resolution of the PWM wave. The resolution of the PWM wave is proportional to the value in the high-resolution counter.

An existing system for closed loop control of duty cycle is disclosed in the patent European Patent No. 1087516, the disclosure of which is hereby incorporated by reference. The patent provides a system and a method for controlling the energization of an electric motor by producing a pulse width modulated command signal for controlling switching devices that connect the motor to an energization source. PWM duty cycle value is formed as a function of the PWM command signal. Further, a leading current with respect to the phase angle of the back EMF is provided to the motor as a function comparing the PWM duty cycle value with a particular value of the threshold voltage. Herein, the PWM duty cycle value is calculated as a function of the PWM command signal. The stated method does not provide precision measurement and control of the PWM duty cycle resolution, and is ineffective in providing an optimized control over PWM duty cycle.

U.S. Pat. No. 6,775,158 (see, FIG. 1) describes another conventional PWM controller, wherein the PWM controller is used to drive an inverter (800), and comprises a feedback circuit (400), a dead time circuit (500) for masking out synchronization conditions occurring when the dead time duration between switching the polarities of desired output AC waveform is greater than or equal to the duration of the PWM source waveform. It further includes a carrier range regulation circuit (210) for reducing PWM duty cycle loss. The PWM controller provides an application specific PWM controller and method. However, the controller does not provide maximal resolution for the PWM duty cycle. Further, the hardware used in the controller adds to the system cost and bulk of the circuitry.

Thus, a need is felt for an application specific method for improving PWM duty cycle resolution to a high precision factor that can be incorporated in a programmable logic device or an embedded system.

SUMMARY OF THE INVENTION

Embodiments of the present invention to provide a PWM generator having improved PWM duty cycle resolution. Embodiments of the present invention further generate sub cycles within the on-time of the input PWM pulse for providing high resolution on-time for multiple PWM cycles.

In accordance with an implementation of the present invention, a computing system is provided for improving duty cycle resolution of a PWM generator. The system comprises a central processing unit, associated memory and input/output devices. A mechanism for improving duty cycle resolution of a PWM generator is included, wherein said mechanism comprises a sub-cycle generator for generating a sub-cycle with a period that is a small fraction of the maximum PWM period to be generated, an integral sub-cycle estimator for determining the integral number of said sub-cycles for on and off time of said PWM waveform, an additional sub-cycle estimator for determining the additional fractional sub-cycle required to provide said on and off time, and a timer for controlling PWM output switching for the on and off time of the integral and additional fractional sub cycles.

Further, the present invention provides a method for generating improved duty cycle resolution for a PWM waveform comprising steps of: defining a sub-cycle with a period that is a small fraction of the maximum PWM period to be generated, determining the integral number of said sub-cycles for on-time of said PWM waveform, determining additional fractional sub-cycle required to provide said on-time, determining the integral number of said sub-cycles for off-time of said PWM waveform, determining additional fractional sub-cycle required to provide said off-time, turning-on the PWM output for said number of on-time integral sub-cycles, turning-on the PWM output for said fraction of on-time sub-cycles as a multiple of a defined resolution factor, turning-off the PWM output for said number of off-time integral sub-cycles, turning-off the PWM output for said fraction of off-time sub-cycles as a multiple of said defined resolution factor, and repeating the foregoing steps for generating multiple cycles of PWM waveform.

Embodiments of the invention therefore provide a system and method for improving PWM duty cycle resolution, by dividing the input PWM input cycle into sub cycles.

In accordance with another embodiment of the invention, a method for generating a PWM signal with improved duty cycle resolution comprises first equalizing M number of PWM cycles in a certain PWM signal to one equalized PWM cycle of an equalized PWM signal. The PWM frequency is then maintained constant by increasing the frequency of a PWM counter for the equalized PWM signal by M times. Lastly, a second equalizing of M number of PWM cycles in an output improved duty cycle resolution PWM signal to one equalized PWM cycle of the equalized PWM signal that has been frequency increased is performed.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

The on-time pulse 100 of the PWM waveform (see, for example, FIG. 3a, but applicable to FIGS. 4a and 5a) is divided into a plurality of sub cycles 102. Computation is performed on the sub cycles for determining the number of integral sub cycles within the plurality of sub cycles and a fractional part at the end of the on-period in the PWM pulse for signifying the commencement of the off-time of the PWM waveform, wherein the off-time is selected for providing maximal resolution. The computation for improving the PWM duty cycle resolution is illustrated as below:

$$\text{Resolution}=1/(2^N-\text{Auto-Reload Value})$$

Where N shows the number of bits used for the counter of the Auto-Reload Timer, and the variable Auto Reload Value indicates the value stored in the Auto Reload Register, wherein the Auto Reload Register value determines the number of sub cycles for obtaining improved resolution in a cycle of the input PWM waveform.

Figure 7:
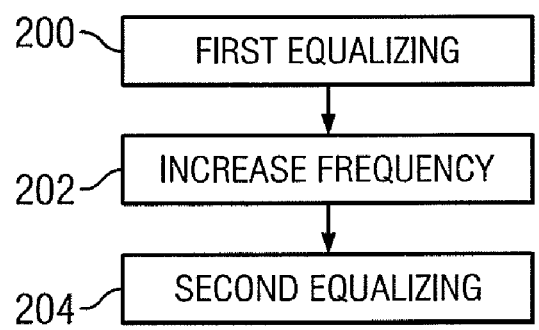
FIG. 7 is a flow diagram illustrating a method in accordance with an embodiment of the invention.

A zero count in the auto reload register indicates the determination of the sub cycles in the PWM pulse, thus indicative of the improved resolution of the PWM duty cycle waveform. The resolution can be improved by equalizing M number of PWM cycles of the input signal 106 to one PWM cycle (as shown, for example, in FIGS. 3b, 4b and 5b and step 200 of FIG. 7) of an equalized signal 120, wherein M is an integral value and is herein defined as the resolution factor. Thus, the resolution will be improved M times. Therefore, the PWM resolution in this case is given by:

$$\text{Resolution}=1/M\times(2^N-\text{Auto-Reload Value})$$

The PWM frequency can be maintained constant by increasing the frequency of PWM counter M times (reference 110 in FIG. 3c and step 202 of FIG. 7), and the resolution can be improved by equalizing (reference 112) M number of PWM cycles in the equalized signal 120 to one PWM cycle (as shown, for example, in FIGS. 3c, 4c and 5c, and step 204 of FIG. 7) of the output signal 124. Thus, the resolution will be improved M times.

For obtaining a constant PWM duty cycle, the pulse during which the PWM pulse is high (on-time) should be increased to M times (see, for example, FIG. 3b at reference 108). Further, if the difference of duty cycle register value and auto-reload register value (representative of pulse width or on-time) is less than $(2^N-1)/M$, then improved resolution is achieved by changing the value of duty cycle register for the first PWM cycle by using the function:

$$\text{Auto-Reload value}+M\times(\text{duty cycle register value}-\text{Auto-Reload value})$$

For the remaining (M−1) PWM cycles it should be a 0% duty cycle (also shown, for example, in FIG. 3b).

Further, if the difference between the duty cycle register value and the auto-reload register value (representative of pulse width or on-time) is less than $2((2^N-1)/M)$, but is greater than or equal to $(2^N-1)/M$ then the improved resolution is achieved by providing a 100% duty cycle for the first PWM cycle (see, for example, FIG. 4b). The duty cycle register value for the second PWM cycle will be:

$$M\times(\text{previous duty cycle register value}-\text{Auto-Reload value})-((2^N-1)-\text{Auto-Reload value})+\text{Auto-Reload Value}$$

and the remaining (M−2) PWM cycles will have 0% PWM duty cycle (as also shown in FIG. 4b).

If the difference between the duty cycle register value and the auto-reload register value (representative of pulse width or on-time) is less than $(2^N-1)$ but greater than or equal to $(M-1)\times(2^N-1)/M$, then the improved resolution is achieved by providing a 100% duty cycle for the first (M−1) PWM cycles (as shown, for example, in FIG. 5b).

The duty cycle register value for the Mth PWM cycle is equal to:

$$M\times(\text{previous duty cycle register value}-\text{Auto-Reload value})-(M-1)\times[(2^N-1)-\text{Auto-Reload value}]+\text{Auto-Reload Value}.$$

Thus, the PWM duty cycle register values are organized for all the M PWM cycles. The PWM frequency can be maintained constant by increasing the frequency of PWM counter M times.

Figure 1:
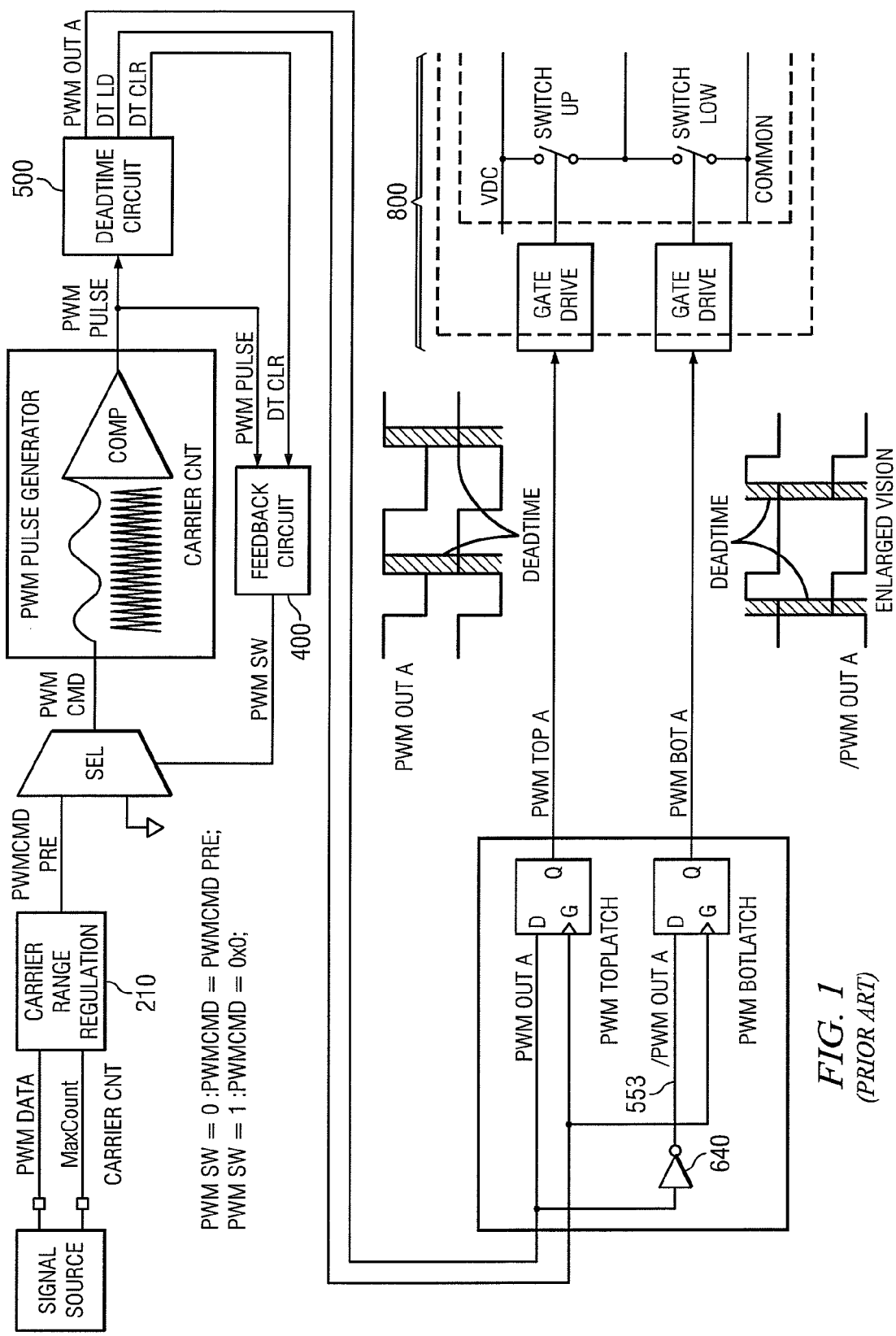
FIG. 1 illustrates a prior art PWM controller and method.
Figure 2:
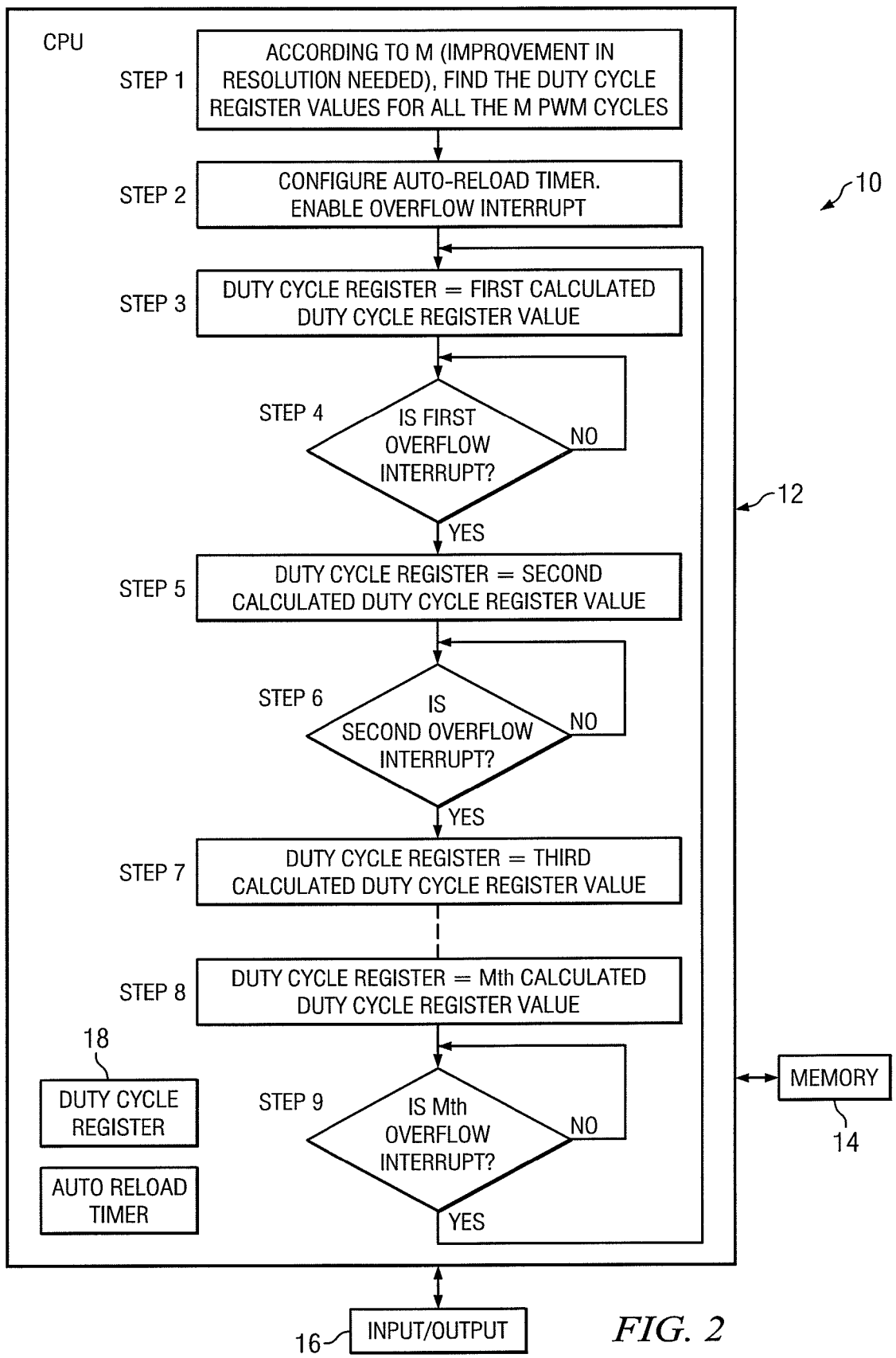
FIG. 2 illustrates the flow diagram of the PWM generator in accordance with the instant invention.

FIG. 2 illustrates the PWM generator system in terms of a flow diagram whose steps are executed by a processing or computing system 10 comprising a central processing unit 12, associated memory 14 (shown as external, but could be internal) and input/output devices 16 (shown as external, but could be internal). Step 1 and 2 illustrate the initialization of the Resolution Factor, configuration of the high resolution Auto Reload Timer and the initialization of the overflow interrupt signal for indicating the accumulation of the PWM sub cycle values in the Duty Cycle Register 18, wherein the duty cycle register is a data storage means in the central processing unit 12. In alternative implementations, the duty cycle register may comprise a data storage means within a micro controller or a Programmable logic device. The overflow interrupt signal is active high when the required PWM resolution is achieved. Steps 3 and 4 further illustrate the accumulation of the integral and fractional sub cycle values for a single PWM cycle, wherein the duty cycle value is accumulated in the duty cycle register 18 for a plurality of functions of the resolution factor. In Step 3, the duty cycle register is set to the first calculated duty cycle register value. A determination is then made in Step 4 as to whether a first overflow interrupt has been reached (i.e., PWM resolution has been achieved with calculated integral and fractional sub cycle values). If not, the process repeats with the sub cycle calculation waiting for the first overflow interrupt to be reached. Thereafter, Steps 5 and 6 accumulate the integral and fractional sub cycle values for a next (i.e., second) PWM cycle. In Step 5, the duty cycle register is set to the second calculated duty cycle register value. A determination is then made in Step 6 as to whether a second overflow interrupt has been reached. If not, the process repeats waiting for the second overflow interrupt to be reached. Steps 7 to 9 illustrate the computation for further optimization in the resolution factor and thus further illustrate the accumulation of the integral and fractional sub cycle values for additional PWM cycle(s). In Step 7, the duty cycle register is set to the third calculated duty cycle register value. A similar overflow interrupt determination (like Steps 4 and 6, although not specifically illustrated) is then performed. This goes on in similar fashion until the Mth (or last) calculated duty cycle register value is processed. So, in Step 8, the duty cycle register is set to the Mth calculated duty cycle register value. A determination is then made in Step 9 as to whether an Mth overflow interrupt has been reached. If not, the process repeats waiting for the Mth overflow interrupt to be reached. Following completion of Step 9, the method is repeated for multiple improvements in resolution in multiple PWM cycles.

Figure 3:
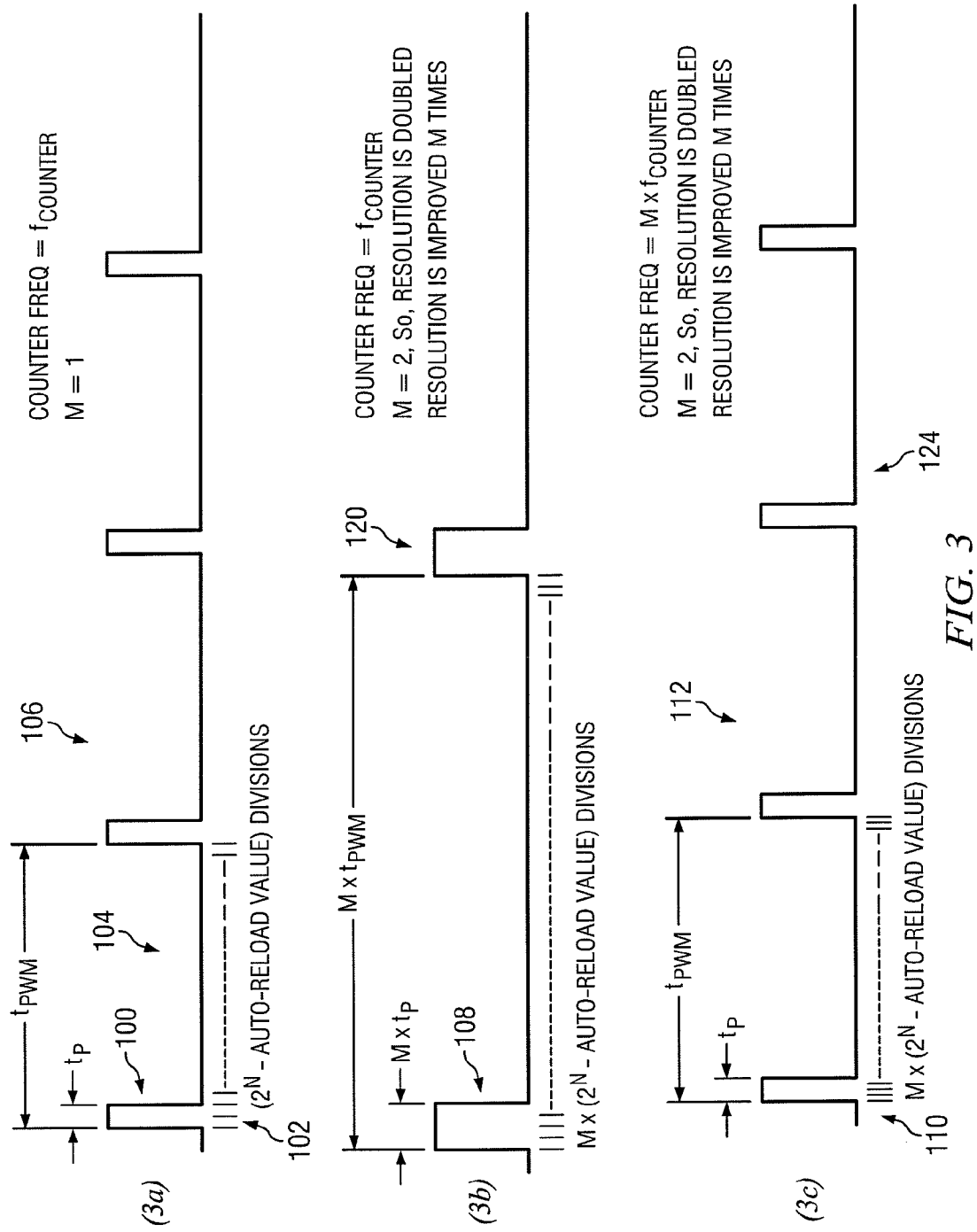
FIG. 3 illustrates the PWM duty cycle waveform for duty cycle register value equal to a first function of the resolution factor in accordance with the instant invention.

The PWM duty cycle is controlled for the following conditions:

First Condition: If (Duty cycle register value−Auto-Reload value)<$(2^N-1)/M$:

This condition is illustrated by PWM waveforms in FIG. 3, wherein it is shown that the effect of the frequency of the Auto Reload Timer improves the PWM resolution, given that the resolution factor M is equal to 2 that depends on the desirable duty cycle resolution for the PWM waveform.

For the first PWM cycle:

Duty cycle register value=Auto-Reload value+$M$×(duty cycle register value−Auto-Reload value), wherein M is the resolution factor (improvement required in resolution).

For the remaining (M−1) PWM cycles:

Duty cycle register value=value which generates 0% PWM duty cycle

Figure 4:
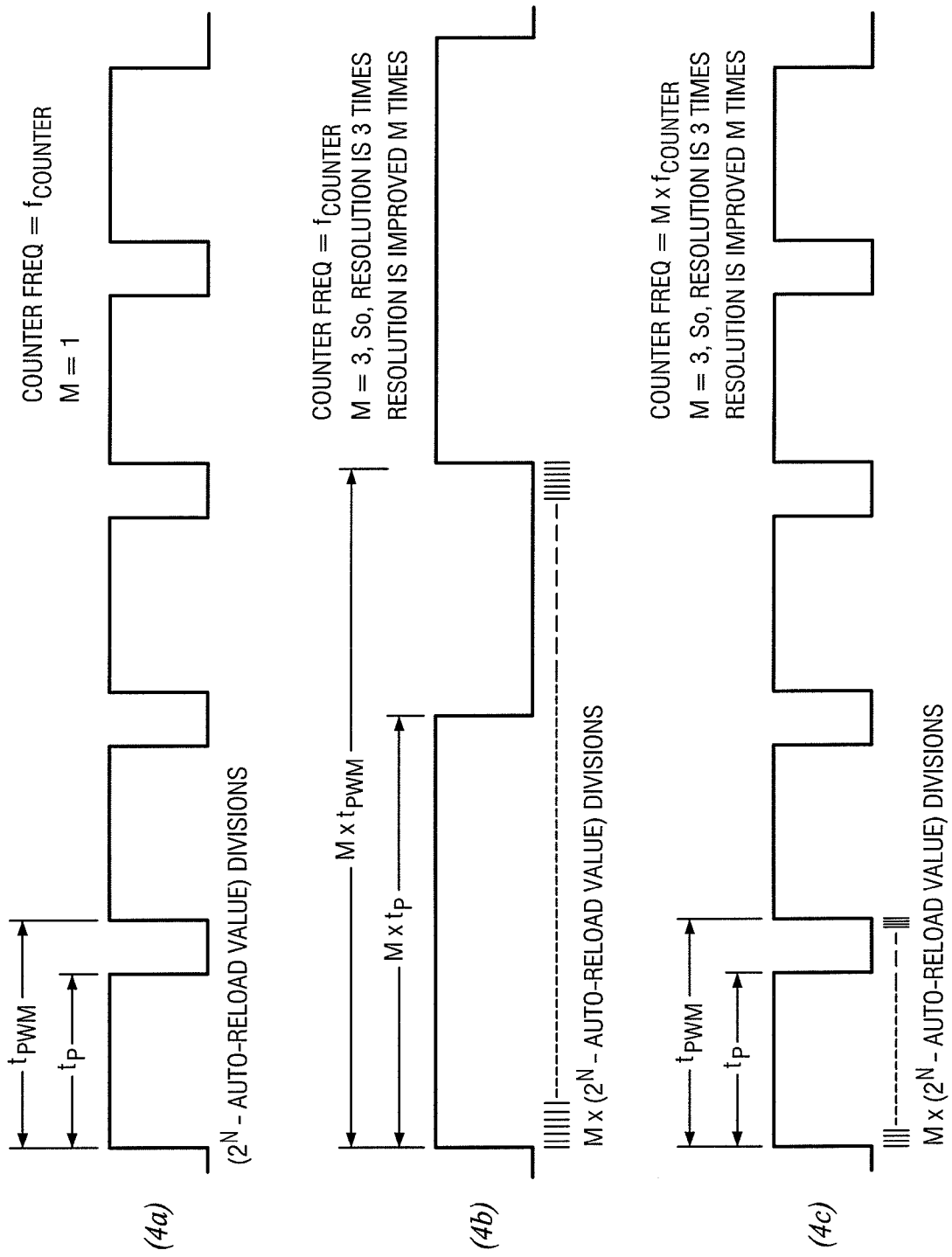
FIG. 4 illustrates the PWM duty cycle waveform for duty cycle register value equal to a second function of the resolution factor in accordance with the instant invention.

Second Condition: If $(2^N-1)/M \leq$(Duty cycle register value−Auto-Reload value)<$2 \times (2^N-1)/M$:

This condition is illustrated by the PWM waveforms in FIG. 4, wherein the improvement in PWM resolution is shown, when the resolution factor is equal to 3.

For the first PWM cycle:

Duty cycle register value=value which generates 100% PWM duty cycle

For the second PWM cycle:

Duty cycle register value=$M$×(previous duty cycle register value−Auto-Reload value)−[$(2^N-1)$−Auto-Reload value]+Auto-Reload Value.

For the remaining (M−2) PWM cycles:

Duty cycle register value=value which generates 0% PWM duty cycle

The process is continued for the remaining cycles for the PWM output.

Third Condition: If $(M-1) \times (2^N-1)/M \leq$(Duty cycle register value−Auto-Reload value)<$(2^N-1)$:

For the first (M−1) PWM cycles:

Duty cycle register value=value which generates 100% PWM duty cycle

For the Mth PWM cycle:

Duty cycle register value=$M$×(previous duty cycle register value−Auto-Reload value)−(M−1)×[$(2^N-1)$−Auto-Reload value]+Auto-Reload Value, wherein the resolution factor M is 3.

Figure 5:
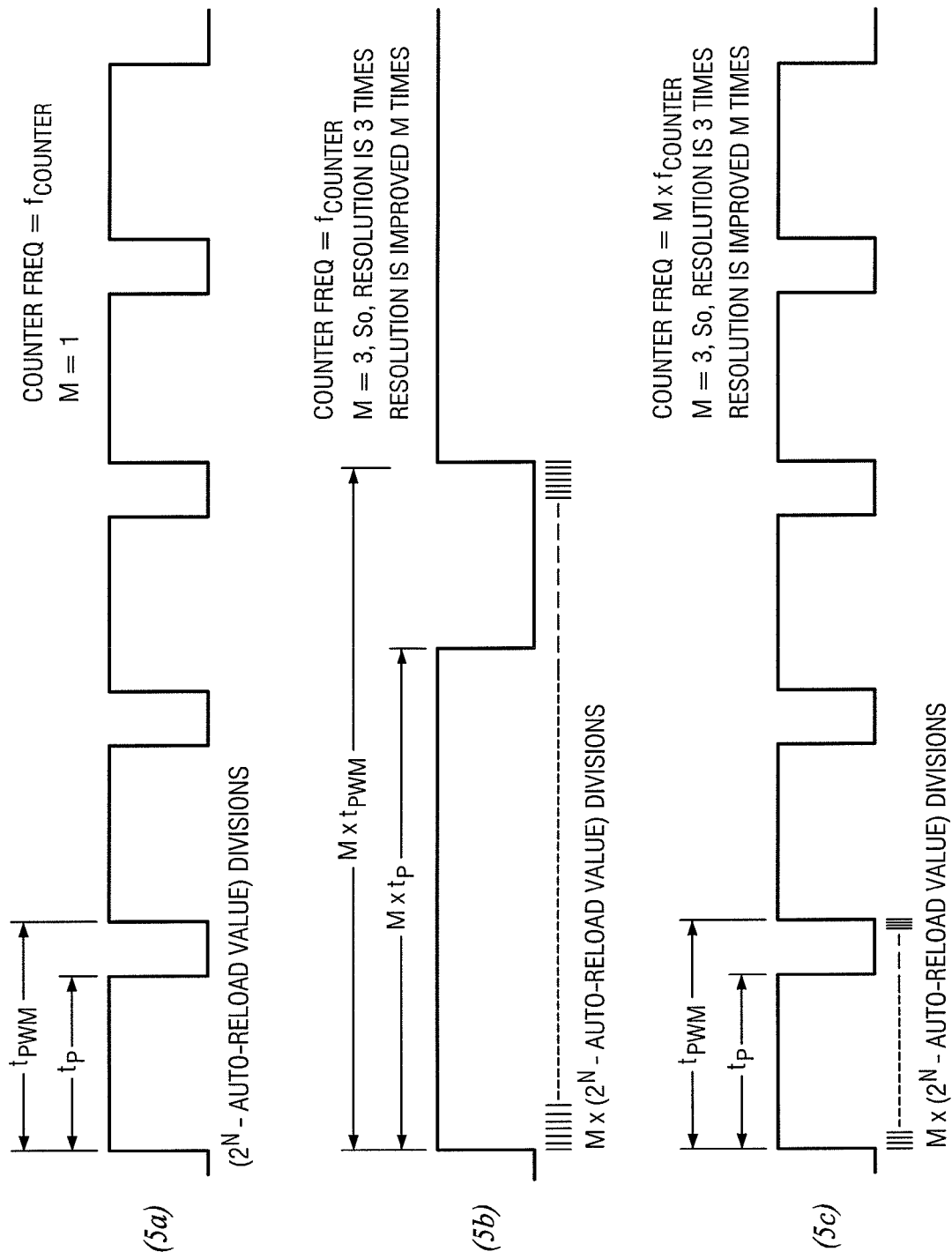
FIG. 5 illustrates the PWM duty cycle waveform for duty cycle register value equal to a third function of the resolution factor in accordance with the instant invention.

The above stated function (computation of resolution for Mth PWM cycle) is graphically illustrated by FIG. 5, wherein the resolution factor is applied as 3 and the resultant waveform for the PWM is observed, therein keeping the duty cycle constant and improvising the resolution. The duty cycle register is herein inputted with a unique function of the resolution factor. The duty cycle register accumulates the sub cycle value for the multiple PWM on and off period, wherein the sub cycle is computed by user-defined functions of the resolution factor.

Figure 6:
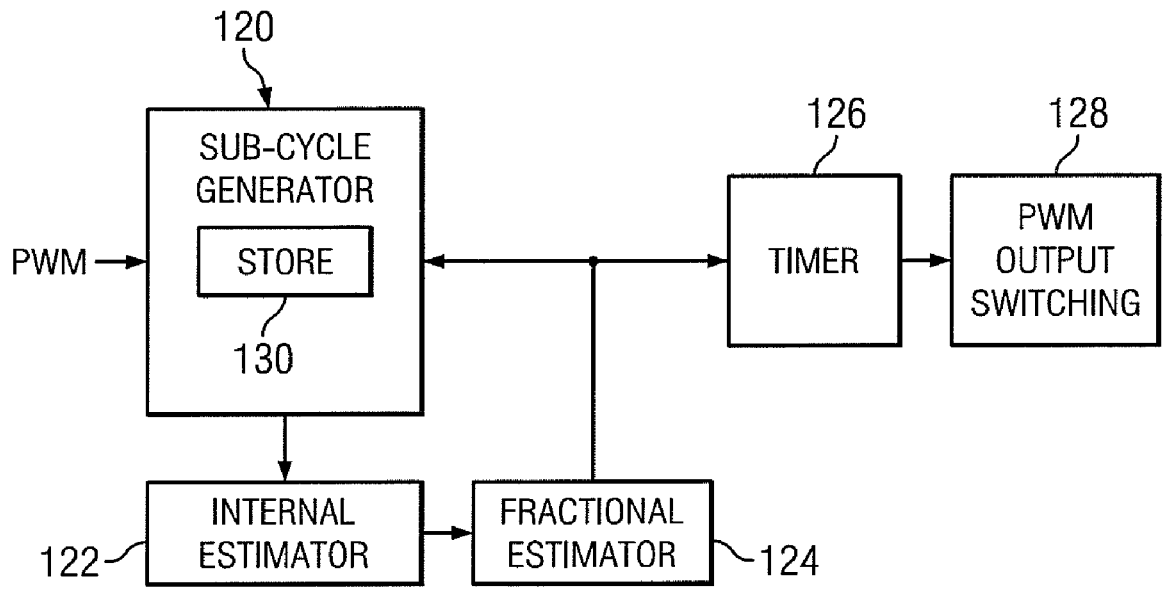
FIG. 6 is a functional block diagram of a computing system in accordance with an embodiment of the invention to provide for improving duty cycle resolution of a PWM generator.

Reference is now made to FIG. 6 wherein there is shown a functional block diagram of a computing system in accordance with an embodiment of the invention to provide for improving duty cycle resolution of a PWM generator. The system comprises a mechanism for improving duty cycle resolution of a PWM generator. The mechanism, which can be implemented along with the central processing unit, micro controller or a Programmable logic device as hardware, software or firmware, comprises a sub-cycle generator 120 for generating a sub-cycle (see, for example, reference 102 in FIG. 3a) with a period that is a small fraction of the maximum PWM period ($t_{pwm}$) to be generated. An integral sub-cycle estimator 122 determines the integral number of said sub-cycles for on (reference 100 in FIG. 3a) and off time 104 of the PWM waveform 106. An additional sub-cycle estimator 124 determines the additional fractional sub-cycle required to provide said on and off time. The sub cycle generator 120 comprises a storage means 128 (such as a register or latch) for accumulating the integral number of said sub-cycles for determining said additional fractional sub cycle. A timer 126 receives the integral and additional fractional sub cycles and controls PWM output switching 128 for the on and off time based upon the determined integral and additional fractional sub cycles. The timer may comprise an auto reload timer.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A computing system for improving duty cycle resolution of a PWM generator comprising a central processing unit, associated memory and input/output devices, and a mechanism for improving duty cycle resolution of a PWM generator, said mechanism comprising:
a sub-cycle generator for generating a sub-cycle with a period that is a small fraction of the maximum PWM period to be generated,
an integral sub-cycle estimator for determining the integral number of said sub-cycles for on and off time of said PWM waveform,
an additional sub-cycle estimator for determining the additional fractional sub-cycle required to provide said on and off time, and
a timer for controlling PWM output switching for the on and off time of the integral and additional fractional sub cycles;
wherein said sub cycle generator comprises a storage means for accumulating the integral number of said sub-cycles for determining said additional fractional sub cycle.

2. The computing system as claimed in claim 1, wherein said storage means comprises a latch for storing data.

3. The computing system as claimed in claim 1, wherein said timer is an auto reload timer.

4. A method for generating improved duty cycle resolution for a PWM waveform using a processing unit and a PWM output switching circuit, comprising the processing unit performing the steps of:
   a. defining a sub-cycle with a period that is a small fraction of the maximum PWM period to be generated,
   b. determining the integral number of said sub-cycles for on-time of said PWM waveform,
   c. determining additional fractional sub-cycle required to provide said on-time,
   d. determining the integral number of said sub-cycles for off-time of said PWM waveform,
   e. determining additional fractional sub-cycle required to provide said off-time,
   f. turning-on the PWM output switching circuit for said number of on-time integral sub-cycles,
   g. turning-on the PWM output switching circuit for said fraction of on-time subcycles as a multiple of a defined resolution factor,
   h. turning-off the PWM output switching circuit for said number of off-time integral sub-cycles,
   i. turning-off the PWM output switching circuit for said fraction of off-time sub-cycles as a multiple of said defined resolution factor, and
   j. repeating steps a to i for generating multiple cycles of PWM waveform.

5. The method for generating improved duty cycle as claimed in claim 4, wherein said defining a subcycle comprises determining the maximum PWM period.

6. The method for generating improved duty cycle as claimed in claim 4, wherein said determining additional fractional sub-cycle comprises registering the integral number of said sub-cycles.

7. The method for generating improved duty cycle as claimed in claim 4, wherein said turning-on and turning-off the PWM output comprises counting a number of pulses which corresponds to said number of additional fractional sub-cycles.

8. A method for generating a PWM signal with improved duty cycle resolution using a processing unit including a PWM timer and a PWM switching circuit, wherein the processing unit performs the following operations:
   first equalizing M number of PWM cycles in a certain PWM signal generated by the PWM output switching circuit to one equalized PWM cycle of an equalized PWM signal;
   maintaining PWM frequency constant by increasing the frequency of the PWM timer for the equalized PWM signal by M times; and
   second equalizing M number of PWM cycles in an output improved duty cycle resolution PWM signal to one equalized PWM cycle of the equalized PWM signal that has been frequency increased; further comprising dividing each PWM cycle of the certain PWM signal into a plurality of sub-cycles wherein each sub-cycle is a small fraction of the PWM cycle, and wherein maintaining causes a number of sub-cycles in each equalized PWM cycle of the equalized PWM signal to be equal to M times the number of sub-cycles in each equalized PWM cycle of the equalized PWM signal.

9. The method of claim 8 wherein first equalizing sets a period of the second equalizing sets a period of the equalized PWM signal to equal M times a period of the certain PWM signal and wherein second equalizing sets a period of the output improved duty cycle resolution PWM signal to equal the period of the certain PWM signal.

10. The method of claim 8 wherein first equalizing comprises setting an on-time of a pulse in the equalized PWM cycle in M times proportion to an on-time of a pulse in the certain PWM signal.

11. The method of claim 10 wherein setting comprises:
    determining if an on-time of a pulse in the certain PWM signal is less than a M-dependent threshold; and
    if so, setting a first PWM cycle in the certain PWM signal to have a partial % duty cycle; and
    setting the next M-1 PWM cycles in the certain PWM signal to have a 0% duty cycle.

12. The method of claim 10 wherein setting comprises:
    determining if an on-time of a pulse in the certain PWM signal greater than a first m-dependent threshold and less than a second M-dependent threshold; and
    if so, setting a first PWM cycle in the certain PWM signal to have a 100% duty cycle;
    setting a second PWM cycle in the certain PWM signal to have a partial % duty cycle; and
    setting the next M-2 PWM cycles in the certain PWM signal to have a 0% duty cycle.

13. The method of claim 10 wherein setting comprises:
    determining if an on-time of a pulse in the certain PWM signal greater than a third M-dependent threshold and less than a maximum threshold; and
    if so, setting a first M-1 PWM cycles in the certain PWM signal to have a 100% duty cycle; and
    setting an Mth PWM cycle in the certain PWM signal to have a partial % duty cycle.

14. Apparatus, comprising:
    a sub-cycle generator for generating a sub-cycle with a period that is a small fraction of a maximum PWM period to be generated, the sub-cycle generator including a store which accumulates an integral number of said sub-cycles;
    an integral sub-cycle estimator for determining the integral number of said sub-cycles for on and off time of said PWM waveform,
    a fractional sub-cycle estimator for determining an additional fractional sub-cycle required to provide PWM on and off time,
    a PWM output switching circuit, and
    a timer which controls operation of the PWM output switching circuit for on and off time in response to the determined integral number of sub-cycles and determined additional fractional sub cycles.

* * * * *

UNITED STATES PATENT AND TRADEMARK OFFICE
CERTIFICATE OF CORRECTION

PATENT NO.       : 7,642,876 B2
APPLICATION NO. : 11/261449
DATED            : January 5, 2010
INVENTOR(S)      : Nitin Agarwal Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1015 days.

Signed and Sealed this

Sixteenth Day of November, 2010

David J. Kappos
*Director of the United States Patent and Trademark Office*